United States Patent
Yamagishi et al.

(10) Patent No.: US 11,469,687 B2
(45) Date of Patent: Oct. 11, 2022

(54) POWER SUPPLY DEVICE

(71) Applicant: HONDA MOTOR CO., LTD., Tokyo (JP)

(72) Inventors: Yoshihiko Yamagishi, Wako (JP); Toru Yuki, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 226 days.

(21) Appl. No.: 16/763,248

(22) PCT Filed: Nov. 17, 2017

(86) PCT No.: PCT/JP2017/041510
§ 371 (c)(1),
(2) Date: Oct. 15, 2020

(87) PCT Pub. No.: WO2019/097682
PCT Pub. Date: May 23, 2019

(65) Prior Publication Data
US 2021/0075341 A1    Mar. 11, 2021

(51) Int. Cl.
*H02M 7/5387* (2007.01)
*H02M 1/08* (2006.01)
*H02P 27/06* (2006.01)

(52) U.S. Cl.
CPC ......... *H02M 7/53871* (2013.01); *H02M 1/08* (2013.01); *H02P 27/06* (2013.01)

(58) Field of Classification Search
CPC .......... H01M 10/0525; H01M 10/486; H01M 10/44; G01R 31/382; G01R 31/3274;
(Continued)

(56) References Cited

U.S. PATENT DOCUMENTS

2007/0108959 A1   5/2007  Amano
2011/0128662 A1   6/2011  Kato et al.
2015/0061376 A1*  3/2015  Hartl ....................... B60L 50/66
                                                307/116

FOREIGN PATENT DOCUMENTS

JP    2003-319507    11/2003
JP    2005-295697    10/2005
(Continued)

OTHER PUBLICATIONS

International Search Report and Written Opinion for International Application No. PCT/JP2017/041510 dated Dec. 12, 2017, 9 pages.

*Primary Examiner* — Said Bouziane
(74) *Attorney, Agent, or Firm* — Amin, Turocy & Watson, LLP

(57) ABSTRACT

A power supply device, provided with: a battery; a capacitor connected in parallel to a load; and a main switching unit capable of switching between a state of connection and a state of disconnection between the battery and the capacitor. The power supply device is provided with a precharge circuit for reducing the current from the battery and supplying the current to the capacitor. A control unit of the power supply device first supplies electric power from the precharge circuit to the capacitor, then sets the main switching unit from a state of disconnection to a state of connection, and stops the supply of electric power from the precharge circuit while the state of connection is established.

7 Claims, 3 Drawing Sheets

(58) Field of Classification Search
CPC .. H02J 7/1438; H02J 7/0068; A01D 34/6806; A01D 34/78; A01D 34/006; A01D 34/82; B60L 7/22; B60L 7/14; B60L 3/0046; H02P 27/08

See application file for complete search history.

(56) References Cited

FOREIGN PATENT DOCUMENTS

| | | |
|---|---|---|
| JP | 2007-143221 | 6/2007 |
| JP | 2011-114974 | 6/2011 |
| JP | 2015-220920 | 12/2015 |

\* cited by examiner

10A(18)

POWER SUPPLY DEVICE

TECHNICAL FIELD

The present invention relates to a power supply device including a capacitor connected in parallel to a load.

BACKGROUND ART

As described in Japanese Laid-Open Patent Publication No. 2015-220920, for example, a power supply device that supplies electric power from a battery to a three-phase alternating-current motor (load) to rotate the motor includes a capacitor connected in parallel to the load so as to smooth the voltage of the load.

In such a circuit, excessive current (inrush current) is supplied to the capacitor as the circuit is switched from a state in which the supply of current is absent to a state in which the supply of current is present by operations of switches and relays disposed between the battery and the capacitor. This inrush current may induce failures of contacts and elements. Accordingly, for example, power supply devices are being developed which are configured to supply small current from the battery to the capacitor through a precharge unit (precharge circuit) before supplying electric power directly from the battery to the capacitor.

However, when the precharge unit is kept connected to the battery, it consumes electric power of the battery by causing a flow of dark current. In an alternative method, a mechanism may be provided so as to switch the supply and stoppage of electric power from the precharge unit to the capacitor according to an operation performed by a user, but this method involves other disadvantages such as increased workload of the user, failure to stop the supply, and the like.

SUMMARY OF INVENTION

The present invention has been made taking such situations into account, and an object of the present invention is to provide a power supply device capable of suppressing the inrush current and reducing power consumption by providing a control unit that suitably controls the supply and stoppage of electric power from the precharge circuit.

In order to achieve the object above, a power supply device according to the present invention includes: a battery; a capacitor connected in parallel to a load to which electric power of the battery is supplied; a main switching unit configured to switch between a connected state and a disconnected state between the battery and the capacitor; a precharge unit including a sub switching unit connected in parallel to the main switching unit, the precharge unit being configured to lower a current of the battery lower than a current that is supplied directly from the battery to the capacitor through the main switching unit and supply the lowered current to the capacitor; and a control unit configured to, first, make the sub switching unit conductive to supply electric power from the precharge unit to the capacitor, and next bring the main switching unit from the disconnected state to the connected state and cut off the conduction of the sub switching unit in the connected state.

In this case, preferably, the precharge unit includes a control-unit switch configured to switch between the supply of the electric power from the precharge unit to the capacitor and stoppage of the supply under a control by the control unit, and a user switch configured to enable the supply of the electric power from the precharge unit to the capacitor under an operation by a user.

In addition to the configuration above, the control unit may be connected to the precharge unit, and the control unit may start operating when the user switch turns on and the electric power is supplied thereto from the precharge unit, and turn on the control-unit switch to supply the electric power from the precharge unit to the capacitor.

The control unit may bring the main switching unit from the disconnected state to the connected state when a given time has passed after the supply of the electric power from the precharge unit to the capacitor is started.

Further, the control unit may be connected to the battery through the main switching unit, and the control unit may turn off the control-unit switch to stop the supply of the electric power when the main switching unit is in the connected state.

Further, preferably, the main switching unit and the control-unit switch are connected respectively to a first control terminal and a second control terminal of the control unit, and change from off to on when a voltage is applied to the first control terminal and the second control terminal by the control unit.

Preferably, the precharge unit includes a bypass line configured to connect the battery and the capacitor while bypassing the main switching unit, and the sub switching unit and a resistor configured to lower current are connected in series on the bypass line.

Further, the load may be a motor configured to be rotationally driven with three-phase alternating current obtained by converting a direct-current voltage supplied from the battery.

According to the present invention, the power supply device is capable of suppressing inrush current and reducing power consumption as the control unit controls operations of the main switching unit and the precharge unit individually. That is, the control unit suppresses inrush current by, when supplying electric power from the battery to the load, first supplying small current to the capacitor through the precharge unit and next supplying electric power directly from the battery to the capacitor through the main switching unit. Furthermore, the control unit stops the supply of electric power from the precharge unit when the main switching unit is in the connected state. Accordingly, after that, dark current flowing from the battery to the precharge unit is certainly cut off. Consequently, the power supply device is capable of suppressing damages to elements and contacts and improving durability, and reliably reducing consumption of electric power of the battery, while reducing workload of the user.

DESCRIPTION OF EMBODIMENTS

The present invention will now be described in detail referring to the accompanying drawings in conjunction with preferred embodiments.

A power supply device according to an embodiment of the present invention is provided in a work machine (not shown) such as a lawn mower, snow blower, cultivator, etc., for example, and functions as an electric power supply source for driving the work machine. For example, such work machines move equipment or perform tasks (e.g. grass cutting with a cutter, snow removal, etc.) by being driven by a rotational driving force of a motor provided therein.

Figure 1:
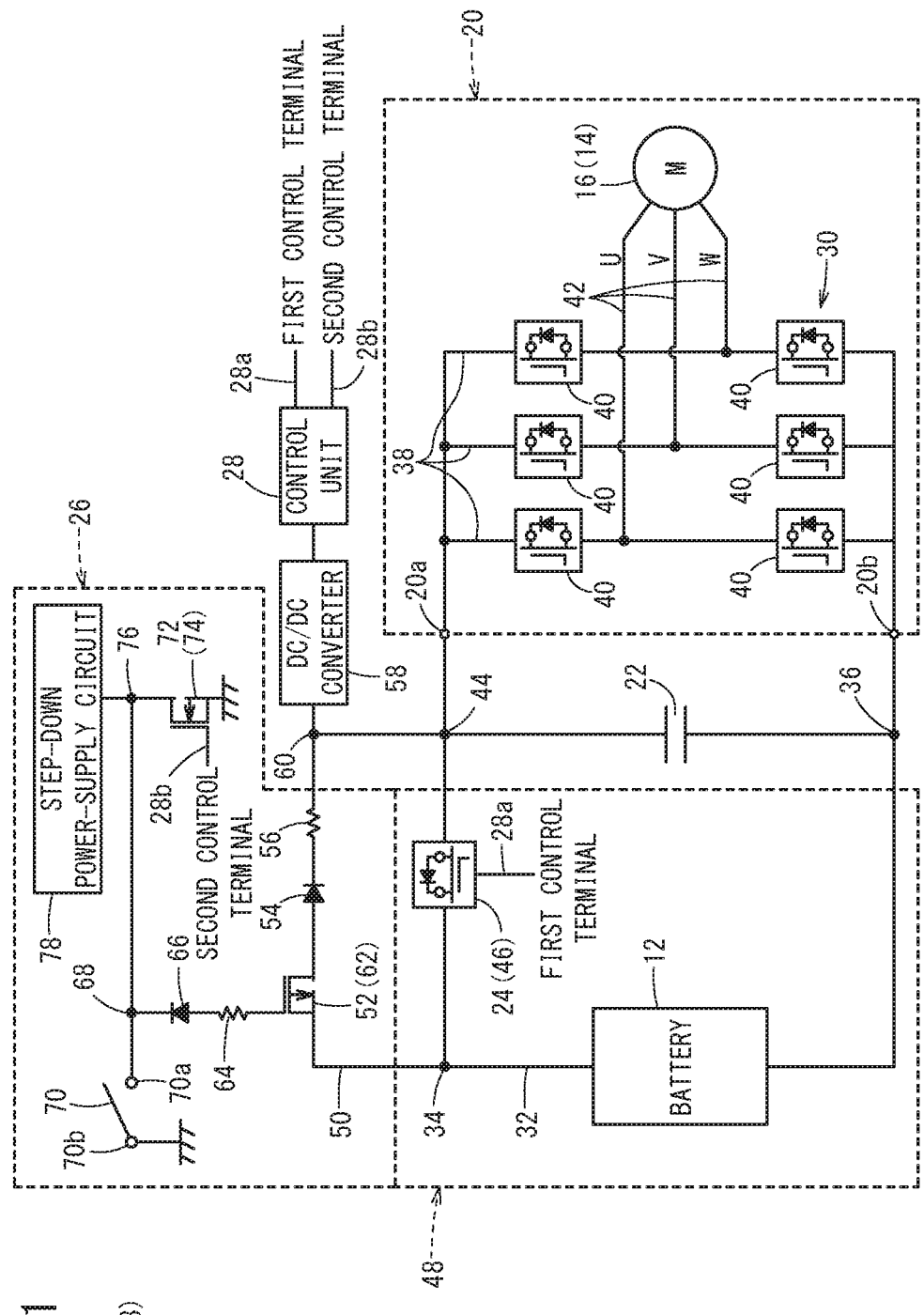
FIG. 1 is a circuit diagram schematically illustrating a circuit in which a power supply device of one embodiment of the present invention is connected to a load.

As shown in FIG. 1, a power supply device 10 of this embodiment includes a battery 12 being a direct-current power supply, and is configured to supply electric power from the battery 12 to a motor 16 being a load 14 of the work machine. That is, in operation, the work machine can perform a task in an arbitrary range because it does not require connecting a power cord etc. for supplying power thereto from outside.

Specifically, the power supply device 10 includes a direct-current power-supply circuit unit 18 including the battery 12 mentioned above, and is connected to a high-potential terminal 20a and a low-potential terminal 20b of a load circuit unit 20 including the motor 16. In addition to the battery 12, the direct-current power-supply circuit unit 18 further includes a capacitor 22, a main switching unit 24, a precharge circuit 26 (precharge unit), and a control unit 28. The load circuit unit 20 includes an inverter circuit 30 as well as the motor 16.

The battery 12 is contained in the work machine and configured to be charged with a certain amount of electric power and output a voltage corresponding to the load 14 (e.g. 200 V). The battery 12 of this type can be a known secondary battery such as a lithium-ion battery, for example. The battery 12 is charged with electric power by being set in a charging unit connected to a household power supply, etc. (not shown) by a user of the work machine. A primary battery may be applied as the battery 12.

One terminal (e.g. high-potential side) of the battery 12 is connected through wiring 32 to a contact 34 that connects to the main switching unit 24 and the precharge circuit 26. The other terminal (e.g. low-potential side) of the battery 12 is connected through the wiring 32 to a contact 36 that connects to the capacitor 22 and the terminal 20b of the load circuit unit 20.

The inverter circuit 30 of the load circuit unit 20 converts output power of the battery 12 from direct current into three-phase alternating current and rotationally drives the motor 16. The inverter circuit 30 includes three arm connections 38 that are connected in parallel to the direct-current power-supply circuit unit 18. Two switching elements 40 are connected in series on each arm connection 38. Lines 42 connecting to coil terminals U, V, W of the motor 16 are connected respectively between the two switching elements 40 on the arm connections 38.

Each switching element 40 is configured by combining a field effect transistor (FET) and a diode serving as a rectifying device, for example. The FET has a gate connected to a control circuit of a driver device (not shown) for driving the motor 16, and the FET turns on when a gate voltage is applied thereto from the control circuit. The inverter circuit 30 is controlled by the control circuit to output driving voltages having phases shifted 120 degrees from each other, respectively to the coil terminals U, V, W of the motor 16. The control circuit may be a component integrated with the control unit 28 (that is, a configuration where the control unit 28 controls driving of the motor 16). The inverter circuit 30 may be configured to convert the output power into polyphase alternating currents other than three-phase alternating currents, according to the structure of the load 14.

The motor 16 may be, for example, a brushless motor that rotates with the three-phase alternating current supplied from the inverter circuit 30.

The main switching unit 24 has the function to switch connection and disconnection of the route through which power is supplied directly from the battery 12 to the load circuit unit 20 and the capacitor 22. One terminal of the main switching unit 24 is connected to the contact 34 that connects to the battery 12 and the precharge circuit 26 through the wiring 32. The other terminal of the main switching unit 24 is connected to a contact 44 that connects to the load circuit unit 20, the precharge circuit 26, and the capacitor 22 through the wiring 32.

For example, like the inverter circuit 30, the main switching unit 24 is formed of a switching element 46 including an FET and a diode connected in parallel to each other. In this case, the gate of the FET is connected to a first control terminal 28a of the control unit 28 through wiring not shown. The FET turns on when a gate voltage is applied thereto from the control unit 28 (it connects the wiring 32). On the other hand, the FET turns off in the absence of the gate voltage from the control unit 28 (it disconnects the wiring 32).

That is, the battery 12 and the main switching unit 24 constitute a main power-supply circuit 48 that supplies electric power directly to the load circuit unit 20 and the capacitor 22 (without lowering the current lower than the current supplied from the precharge circuit 26).

As mentioned earlier, the capacitor 22 in the direct-current power-supply circuit unit 18 is connected in parallel to the motor 16 (load circuit unit 20). That is, one terminal of the capacitor 22 is connected to the contact 44 that connects to the load circuit unit 20, the main switching unit 24, and the precharge circuit 26, through the wiring 32. The other terminal of the capacitor 22 is connected to the contact 36 that connects to the battery 12 and the load circuit unit 20.

In this way, since the capacitor 22 is connected in parallel to the inverter circuit 30, the capacitor 22 can suppress voltage variation of the battery 12 and smooth voltage surges etc. when the switching elements 40 of the inverter circuit 30 switch. It is preferred that the capacitor 22 of this type have sufficiently large capacitance, and hence capacitors such as an aluminum electrolytic capacitor are applicable thereto, for example.

On the other hand, the precharge circuit 26 in the direct-current power-supply circuit unit 18 includes a bypass line 50 that constitutes part of the wiring 32 of the direct-current power-supply circuit unit 18 and that is connected in parallel to the main switching unit 24 (i.e., it bypasses the main switching unit 24). One end of the bypass line 50 is connected to the contact 34 to which the battery 12 and the main switching unit 24 connect. The other end of the bypass line 50 is connected to the contact 44 to which the load circuit unit 20, the main switching unit 24, and the capacitor 22 connect.

A sub switching unit 52, a diode 54, and a resistor 56 are connected in series on the bypass line 50. Further, a contact 60 connected to a DC/DC converter 58 is provided in the middle of the bypass line 50 (downstream of the resistor 56). The control unit 28 is connected to this DC/DC converter 58 and operates with supply of electric power from the battery 12.

The sub switching unit 52 is constituted as a switching element 62 employing a P-type channel FET (MOSFET). A resistor 64 and a diode 66 are connected in series to the gate of the sub switching unit 52. The diode 66 has its anode terminal connected to the resistor 64 and its cathode terminal connected to a contact 68 through the wiring 32.

A user switch 70 is connected to the contact 68 through the wiring 32. The user switch 70 allows the user of the work machine to switch the operating state of the precharge circuit 26. The user switch 70 has one switch contact 70a connected to the contact 68 and another switch contact 70b connected to ground (GND). For example, the user switch 70 is configured as a push button, in which case the switch contact 70a and the switch contact 70b are connected when the user pushes the button, and return automatically to the original position when the user stops pushing.

A control-unit switch 72, which is on/off controlled under a control by the control unit 28, is also connected to the contact 68 through the wiring 32 and a contact 76. The control-unit switch 72 is configured as a switching element 74 employing an N-type channel FET (MOSFET). The control-unit switch 72 has its drain connected to the contact 76 through the wiring 32 and its source connected to ground (GND). The gate of the control-unit switch 72 is connected to a second control terminal 28b of the control unit 28 through the wiring 32.

Further, a step-down power-supply circuit 78 configured to lower the output voltage of the battery 12 to a given voltage is connected to the contact 76. The step-down power-supply circuit 78 applies the given voltage to the gate of the sub switching unit 52 when the user switch 70 and the control-unit switch 72 are both off. This causes the sub switching unit 52 to cut off the bypass line 50, i.e., places the bypass line 50 into a disconnected state.

On the other hand, when at least one of the user switch 70 and the control-unit switch 72 is on, the electric power of the step-down power-supply circuit 78 flows to the switch being on. That is, the application of given voltage to the gate of the sub switching unit 52 is ceased (the voltage becomes 0) and hence the sub switching unit 52 becomes conductive between its source and drain, i.e., it places the bypass line 50 into a connected state.

The resistor 64 disposed between the sub switching unit 52 and the contact 68 is set at a given resistance value so as to cause the current flowing to the gate of the sub switching unit 52 to be a very small value. The diode 66 disposed between the sub switching unit 52 and the contact 68 causes the voltage flowing to the gate to stay constant at a given value.

The diode 54 in the precharge circuit 26 is disposed between the sub switching unit 52 and the capacitor 22, and has its anode connected to the source of the sub switching unit 52 through the bypass line 50, and its cathode connected to the resistor 56 therethrough. The diode 54 defines the direction of current flowing in the precharge circuit 26.

The resistor 56 disposed between the sub switching unit 52 and the capacitor 22 is set at a given resistance value and causes the current flowing from the precharge circuit 26 to the capacitor 22 to be a small value. This resistor 56 may be formed of a variable resistor, where it may vary its resistance value with temperature variation by using a thermistor, for example.

The DC/DC converter 58 and the control unit 28 are disposed between the contact 60 and ground (not shown), and are supplied with electric power from both of the main power-supply circuit 48 and the precharge circuit 26. The DC/DC converter 58 converts the voltage supplied from the main power-supply circuit 48 or the precharge circuit 26 into voltage with which the control unit 28 can operate.

The control unit 28 is formed of a known microcomputer (micro) including a processor, memory, etc. The control unit 28 is driven by the power supply from the precharge circuit 26 or the main power-supply circuit 48, and controls the power supply device 10 as the processor executes a program (not shown) stored in the memory.

The control unit 28 includes the first control terminal 28a connected to the gate of the main switching unit 24 and the second control terminal 28b connected to the gate of the control-unit switch 72. The first control terminal 28a applies given voltage to the gate of the main switching unit 24 or does not apply voltage thereto. Similarly, the second control terminal 28b applies given voltage to the gate of the control-unit switch 72, or does not apply voltage thereto. That is, the control unit 28 is capable of separately and individually controlling the main switching unit 24 between on and off and the control-unit switch 72 between on and off.

Next, operations of the power supply device 10 having the above-described configuration will be described.

When the work machine provided with the power supply device 10 is used, it is started under a control by the user and rotationally drives the motor 16 based on electric power supplied from the battery 12. In the operation, the capacitor 22 connected in parallel to the load circuit unit 20 stores electric charge by being supplied with electric power from the battery 12 and discharges electric charge to the inverter circuit 30, to thereby smooth the varying voltage.

Figure 2:
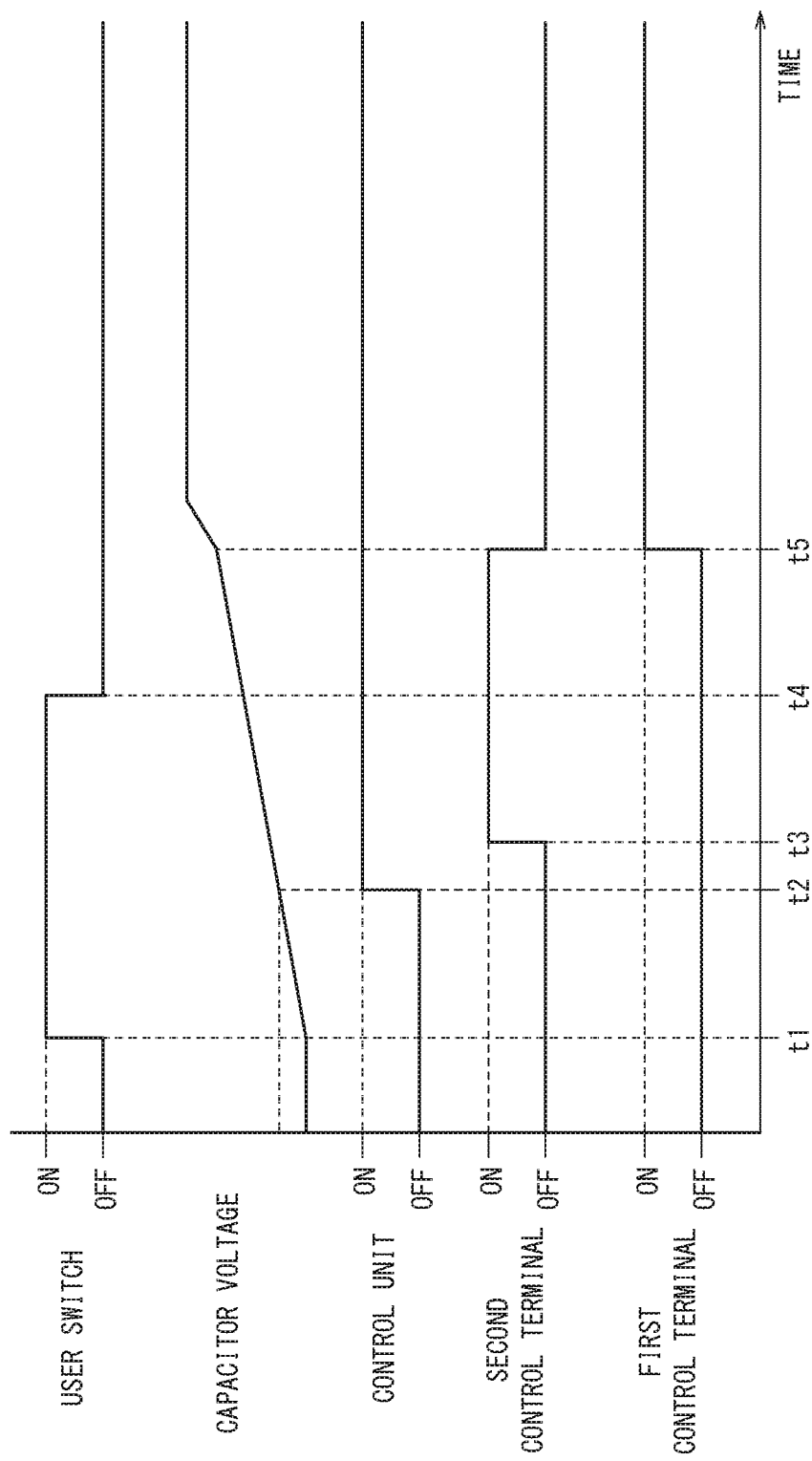
FIG. 2 is a time chart illustrating operations of components of the power supply device.

Specifically, the power supply device 10 operates as illustrated in the time chart of FIG. 2 when it starts. That is, before the user turns on the user switch 70, the user switch 70 and the control-unit switch 72 are both off. Accordingly, the electric power from the step-down power-supply circuit 78 passes through the resistor 64 and the diode 66 to have given voltage and is applied to the gate of the sub switching unit 52. The main switching unit 24 and the control-unit switch 72 are both off since the control unit 28 is in a non-operating state. As a result, the main power-supply circuit 48 and the precharge circuit 26 (bypass line 50) are not connected to the capacitor 22. Thus, when the work machine is not driven, the power supply device 10 can stand by without consuming electric power of the battery 12 almost at all (suppressing dark current), thus contributing to lengthened operating time.

Then, at time t1 in FIG. 2, suppose that the user turns on the power supply of the work machine (turns on the user switch 70). As the user switch 70 is turned on, the voltage that the step-down power-supply circuit 78 applies to the gate flows to ground through the user switch 70. Consequently, the application of the voltage to the gate of the sub switching unit 52 is ceased and hence the sub switching unit 52 becomes conductive between the drain and source of the switching element 62, i.e., it places the bypass line 50 into a connected state.

As a result, the electric power of the battery 12 is supplied to the capacitor 22 through the sub switching unit 52, the diode 54, and the resistor 56 of the precharge circuit 26. At this time, in the precharge circuit 26, the resistor 56 causes the current to become a small amount to prevent inrush current flowing into the capacitor 22. The capacitor 22 gradually accumulates the electric power supplied from the precharge circuit 26 (battery 12) previously.

The electric power supplied from the battery 12 through the precharge circuit 26 is supplied also to the control unit 28 through the DC/DC converter 58. Then, at time t2 in FIG. 2, the voltage supplied to the control unit 28 reaches the driving voltage of the control unit 28 and then the control unit 28 starts driving. As the driving starts, the control unit 28 executes and processes the program and applies voltage to the second control terminal 28b that has been applied with no voltage. Then, at time t3 in FIG. 2, the control-unit switch 72 in the precharge circuit 26 turns on, and then the electric power of the step-down power-supply circuit 78 flows to ground through the control-unit switch 72.

Thus, the control unit 28 keeps the connected state in the sub switching unit 52 of the precharge circuit 26. Hence, even when the user switch 70 changes from on to off at time t4 in FIG. 2, the supply of small electric power to the capacitor 22 by the precharge circuit 26 continues.

After the supply of electric power from the precharge circuit 26 to the capacitor 22 is started (after the application of voltage to the second control terminal 28*b*), the control unit 28 measures time. Then, when a given precharge time has passed, the control unit 28 switches to the supply of electric power from the main power-supply circuit 48. That is, at time t5 in FIG. 2, the control unit 28 applies voltage to the first control terminal 28*a* to change the main switching unit 24 from off to on. The main power-supply circuit 48 is thus connected to the capacitor 22. That is, the electric power of the battery 12 is supplied directly from the main power-supply circuit 48 to the capacitor 22 after the capacitor 22 has accumulated a certain amount of electric power.

The electric power of the battery 12 is supplied directly from the main power-supply circuit 48 also to the control unit 28 through the DC/DC converter 58. This allows the control unit 28 to stably operate to control the power supply device 10.

As the supply of electric power from the main power-supply circuit 48 to the capacitor 22 and the motor 16 (load circuit unit 20) starts, the control unit 28 stops applying voltage to the second control terminal 28*b*. As a result, the control-unit switch 72 in the precharge circuit 26 turns off, and the voltage of the step-down power-supply circuit 78 is applied to the gate of the sub switching unit 52, causing the sub switching unit 52 to place the bypass line 50 into the disconnected state. That is, the control unit 28 can prevent power loss in the precharge circuit 26 by cutting off the sub switching unit 52 immediately after the main power-supply circuit 48 has become conductive. Further, it is also possible to certainly prevent failure to turn off the precharge circuit 26.

As described so far, the power supply device 10 of this embodiment offers the effects below.

The power supply device 10 is capable of suppressing inrush current and reducing power consumption as the control unit 28 controls operations of the main switching unit 24 and the precharge circuit 26 individually. That is, the control unit 28 suppresses inrush current by, when supplying electric power from the battery 12 to the load 14, first supplying small current to the capacitor 22 through the precharge circuit 26 and next supplying electric power directly from the battery 12 to the capacitor 22 through the main switching unit 24. Furthermore, the control unit 28 cuts off the supply of electric power from the precharge circuit 26 when the main switching unit 24 is in the connected state. Accordingly, after that, dark current flowing from the battery 12 to the precharge circuit 26 is certainly cut off. Consequently, the power supply device 10 is capable of suppressing damages to elements and contacts and improving durability, and reliably reducing consumption of electric power of the battery 12, while reducing workload of the user.

In this case, the precharge circuit 26, including the control-unit switch 72 and the user switch 70, is capable of implementing both of the switching performed by the control unit 28 and the switching performed by the user, between the supply and the stoppage of electric power of the precharge circuit 26. Consequently, according to the power supply device 10, it is possible to simplify the configuration for enabling the user to operate the power supply, to thereby reduce manufacturing costs.

Moreover, the power supply device 10 is capable of easily starting its operation through the supply of electric power from the precharge circuit 26, since the control unit 28 and the precharge circuit 26 are connected to each other. Furthermore, inrush current flowing to the DC/DC converter 58 is prevented because the precharge circuit 26 supplies small current to the DC/DC converter 58 to which the control unit 28 is connected. Also, electric power can be suitably supplied from the precharge circuit 26 to the capacitor 22 as the control unit 28 turns on the control-unit switch 72 when the operation starts.

Furthermore, according to the power supply device 10, electric power can be supplied from the battery 12 to the capacitor 22 and the load 14 after the capacitor 22 has been supplied with a suitable amount of electric power, since the control unit 28 controls the timing of switching of the main switching unit 24.

Moreover, the power supply device 10 can continue operating in a preferable manner because electric power is supplied while the main switching unit 24 is in the connected state. While the main switching unit 24 is in the connected state, it is not necessary to supply electric power from the precharge circuit 26 to the capacitor 22 and the control unit 28, and therefore the control-unit switch 72 can be turned off to stop the supply of electric power, to thereby eliminate consumption of electric power in the precharge circuit 26 at an early stage.

Furthermore, the main switching unit 24 and the control-unit switch 72 are each configured as an electronic switch that changes from off to on with the application of voltage from the first and second control terminals 28*a*, 28*b* of the control unit 28. Consequently, the power supply device 10 is capable of switching between the charging from the precharge circuit 26 to the capacitor 22 and the charging from the main power-supply circuit 48 to the capacitor 22, while suppressing power consumption.

The resistor 56 provided on the bypass line 50 in the precharge circuit 26 can sufficiently lower the current supplied from the battery 12. Further, according to the power supply device 10, the sub switching unit 52 can switch the bypass line 50 between the connected state and disconnected state, and, in the disconnected state, the bypass line 50 is cut off to reliably eliminate the power supply from the battery 12.

Then, according to the power supply device 10 of this embodiment, the direct-current voltage of the battery 12 that has been smoothed by the capacitor 22 is suitably converted into three-phase alternating current and supplied to rotationally drive the motor 16. Furthermore, the power supply device 10 achieves improved durability because the operations of the precharge circuit 26 and the control unit 28 suppress inrush current and reduce damages to circuit contacts and elements.

The present invention is not limited to the embodiment described above, but can be modified in various manners according to the essence and gist of the invention. For example, the structures of the switching elements 46, 62, 74 etc. of the direct-current power-supply circuit unit 18 are not particularly restricted, and various structures can be employed.

Figure 3:
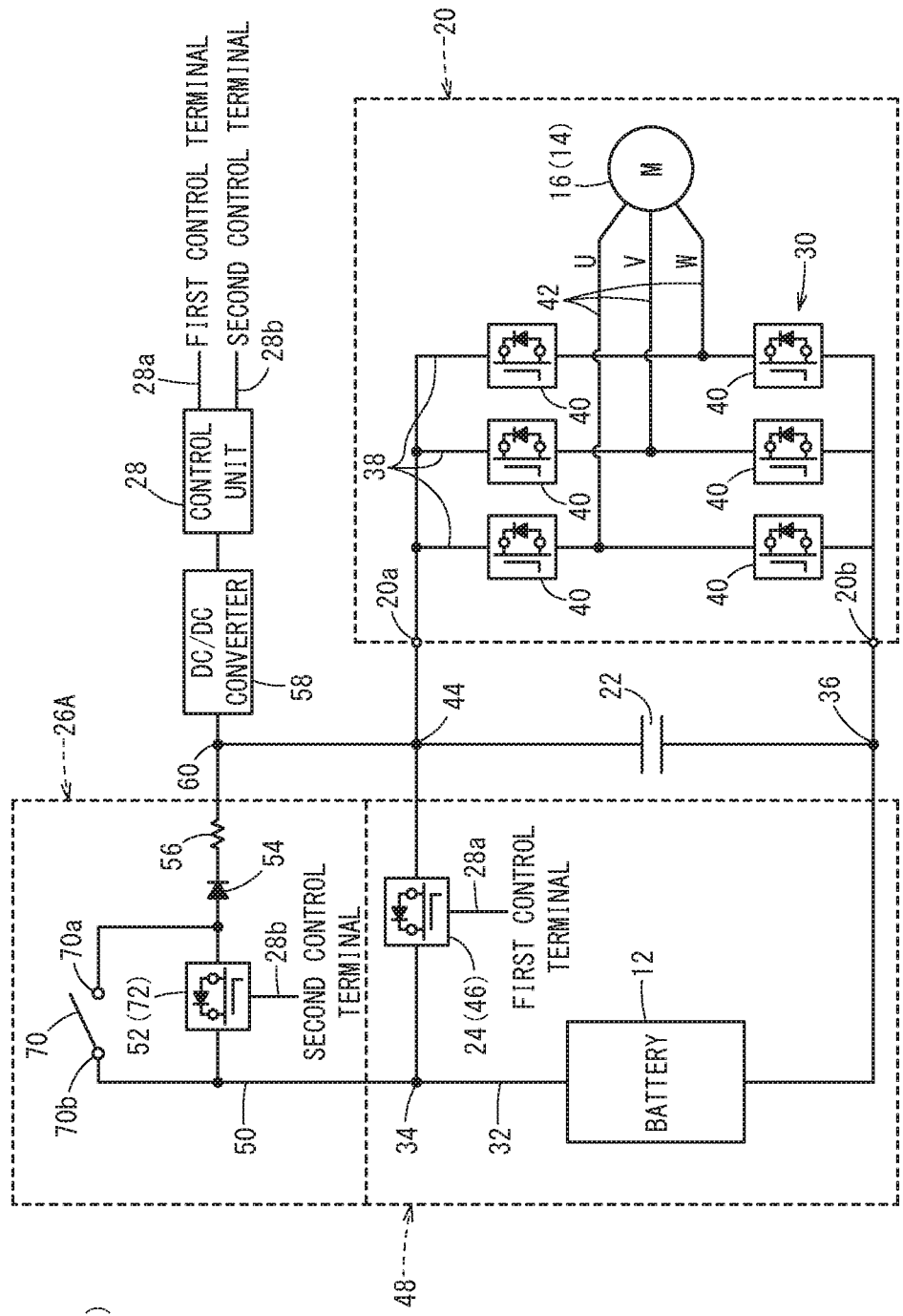
FIG. 3 is a circuit diagram schematically illustrating a circuit in which a power supply device of another embodiment of the present invention is connected to a load.

A power supply device 10A of another embodiment shown in FIG. 3 differs from the power supply device 10 of the embodiment in that the control-unit switch 72 is provided on the bypass line 50 of a precharge circuit 26A and the user switch 70 is connected in parallel to the control-unit switch 72. That is, the control-unit switch 72 functions as the sub switching unit 52 that switches the bypass line 50 between the connected state and disconnected state. As well as the control-unit switch 72, the diode 54 and the resistor 56 are also connected in series on the bypass line 50.

In this case, the control-unit switch 72 employs the same configuration as the main switching unit 24 (the switching element 46 including the FET and the diode connected in parallel), and the second control terminal 28*b* of the control unit 28 is connected to the gate of the FET. That is, the control-unit switch 72 places the bypass line 50 into the connected state in the presence of voltage applied to the second control terminal 28*b*, and places the bypass line 50 into the disconnected state in the absence of voltage applied to the second control terminal 28*b*.

The user switch 70 has a switch contact 70*a* connected to the bypass line 50 between one end of the control-unit switch 72 and the diode 54, and a switch contact 70*b* connected to the bypass line 50 between the other end of the control-unit switch 72 and the battery 12.

The power supply device 10A thus constructed can operate in the same way as the power supply device 10. That is, when the user turns on the user switch 70, the electric power of the battery 12 is supplied to the capacitor 22 and the control unit 28 (DC/DC converter 58) through the user switch 70, the diode 54, and the resistor 56. This causes the control unit 28 to start driving.

After the start of driving, the control unit 28 applies voltage to the second control terminal 28*b* to turn on the control-unit switch 72, thereby bringing the bypass line 50 into the connected state. Then, the electric power of the battery 12 is supplied to the capacitor 22 and the control unit 28 through the control-unit switch 72, the diode 54, and the resistor 56. Accordingly, the driving of the control unit 28 continues even when the user switch 70 turns off.

Having supplied electric power to the capacitor 22 from the precharge circuit 26A for a given time period, the control unit 28 then applies voltage to the first control terminal 28*a* to turn on the main switching unit 24. As a result, electric power is supplied directly from the main power-supply circuit 48 to the capacitor 22, to charge the capacitor 22 and to rotationally drive the motor 16.

In this way, the power supply device 10A offers the same effects as the power supply device 10. In particular, the precharge circuit 26A of the power supply device 10A has a still simpler configuration and so manufacturing costs can be further reduced.

What is claim is:
1. A power supply device comprising:
a battery;
a capacitor connected in parallel to a load to which electric power of the battery is supplied;
a main switching unit configured to switch between a connected state and a disconnected state between the battery and the capacitor;
a precharge unit including a sub switching unit connected in parallel to the main switching unit, the precharge unit being configured to lower a current of the battery lower than a current that is supplied directly from the battery to the capacitor through the main switching unit and supply the lowered current to the capacitor; and
a control unit configured to, first, make the sub switching unit conductive to supply electric power from the precharge unit to the capacitor, and next bring the main switching unit from the disconnected state to the connected state and cut off the conduction of the sub switching unit in the connected state,
wherein the precharge unit includes a control-unit switch configured to switch between the supply of the electric power from the precharge unit to the capacitor and stoppage of the supply under a control by the control unit, and a user switch configured to enable the supply of the electric power from the precharge unit to the capacitor under an operation by a user.

2. The power supply device according to claim 1, wherein the control unit is connected to the precharge unit, and
the control unit starts operating when the user switch turns on and the electric power is supplied thereto from the precharge unit, and turns on the control-unit switch to supply the electric power from the precharge unit to the capacitor.

3. The power supply device according to claim 2, wherein the control unit brings the main switching unit from the disconnected state to the connected state when a given time has passed after the supply of the electric power from the precharge unit to the capacitor is started.

4. The power supply device according to claim 3, wherein the control unit is connected to the battery through the main switching unit, and
the control unit turns off the control-unit switch to stop the supply of the electric power when the main switching unit is in the connected state.

5. The power supply device according to claim 1, wherein the main switching unit and the control-unit switch are connected respectively to a first control terminal and a second control terminal of the control unit, and change from off to on when a voltage is applied to the first control terminal and the second control terminal by the control unit.

6. The power supply device according to claim 1, wherein the precharge unit includes a bypass line configured to connect the battery and the capacitor while bypassing the main switching unit, and
the sub switching unit and a resistor configured to lower current are connected in series on the bypass line.

7. The power supply device according to claim 1, wherein the load is a motor configured to be rotationally driven with three-phase alternating current obtained by converting a direct-current voltage supplied from the battery.

* * * * *